(12) United States Patent
Onishi

(10) Patent No.: US 8,817,482 B2
(45) Date of Patent: Aug. 26, 2014

(54) IN-VEHICLE ELECTRONIC DEVICE

(75) Inventor: Tadaaki Onishi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 197 days.

(21) Appl. No.: 13/619,235

(22) Filed: Sep. 14, 2012

(65) Prior Publication Data

US 2013/0070433 A1 Mar. 21, 2013

(30) Foreign Application Priority Data

Sep. 15, 2011 (JP) ................................. 2011-202269

(51) Int. Cl.
*H05K 5/00* (2006.01)
*H01Q 1/12* (2006.01)

(52) U.S. Cl.
CPC .......... *H01Q 1/1271* (2013.01); *H05K 5/0013* (2013.01)
USPC ........... 361/752; 361/801; 361/802; 361/726; 361/747

(58) Field of Classification Search
CPC ...... H05K 5/0013; H05K 5/0021; F16B 5/07; H01Q 1/1271; E05C 19/06; E05C 19/063
USPC ......... 361/726, 732, 747, 759, 801, 802, 748, 361/752; 455/575.1, 550.1, 575.8
See application file for complete search history.

(56) References Cited

U.S. PATENT DOCUMENTS

| | | | |
|---|---|---|---|
| 7,078,620 B2 * | 7/2006 | Ikeda et al. ..................... 174/50 |
| 7,317,424 B2 * | 1/2008 | Onishi et al. .................. 343/713 |
| 7,482,989 B2 * | 1/2009 | Nakagawa et al. ........... 343/713 |
| 7,766,234 B2 * | 8/2010 | Nam .............................. 235/439 |
| 7,984,540 B2 * | 7/2011 | Blakeway ........................ 29/428 |
| 8,020,902 B1 * | 9/2011 | Li ..................................... 292/80 |
| 2001/0024175 A1 * | 9/2001 | Takenobu ....................... 343/713 |
| 2003/0075006 A1 * | 4/2003 | Coffin et al. ............... 74/577 SF |
| 2005/0285806 A1 * | 12/2005 | Ikeda et al. .................... 343/713 |
| 2012/0027511 A1 * | 2/2012 | Wei et al. ....................... 403/381 |
| 2012/0187812 A1 * | 7/2012 | Gerst ............................ 312/237 |

FOREIGN PATENT DOCUMENTS

| | | |
|---|---|---|
| JP | 5-25776 | 4/1993 |
| JP | 2010-132216 | 6/2010 |
| JP | 2010132216 A * | 6/2010 |

* cited by examiner

*Primary Examiner* — Lisa Lea Edmonds
*Assistant Examiner* — Keith Depew
(74) *Attorney, Agent, or Firm* — Brinks Gilson & Lione

(57) ABSTRACT

An in-vehicle electronic device includes a circuit board in which a preamplifier circuit, and the like are provided, and a holding case, which stores the circuit board. The holding case is configured by combining a lower case which is fixed to a glass surface in which an antenna radiation conductor is arranged, and an upper case which is detachably mounted on the lower case so as to cover the lower case, so that a connection terminal held in the lower case is brought into press-contact with an electrode of the circuit board. When the upper case is removed from the lower case, an elastic piece is bent by pushing a tip of a protruded portion to a base end side, or a snap claw is separated from a locking hole by inserting a tool such as a driver, in between a tongue piece and the elastic piece.

4 Claims, 6 Drawing Sheets

IN-VEHICLE ELECTRONIC DEVICE

CLAIM OF PRIORITY

This application claims benefit of Japanese Patent Application No. 2011-202269 filed on Sep. 15, 2011, which is hereby incorporated by reference in its entirety.

BACKGROUND OF THE DISCLOSURE

1. Field of the Disclosure

The present disclosure relates to an in-vehicle electronic device which is mounted on a glass surface of a window of a vehicle on which an antenna radiation conductor is arranged to thereby be used, and more particularly to, a case structure of an in-vehicle electronic device which stores, within a holding case, a circuit board in which a preamplifier circuit connected with the antenna radiation conductor, and the like is provided.

2. Description of the Related Art

In the related art, techniques in which a glass surface of a window of a vehicle (for example, a rear window) is used as a disposition space of an antenna radiation conductor are widely known, and these are becoming widespread along with switch to terrestrial digital television broadcasting.

However, signal waves for terrestrial digital broadcasting and the like are required to rapidly amplify a signal received by the antenna radiation conductor, so that excellent reception sensitivity may be obtained by minimizing the attenuation of the received signal. Therefore, in an antenna device in which an antenna radiation conductor is arranged on a glass surface of a window of a vehicle, typically, an electronic device including a built-in circuit board in which a preamplifier circuit is provided is made close to the antenna radiation conductor to thereby be mounted on the same glass surface, so that a foreign signal is transmitted to a reception circuit, and the like via the preamplifier circuit.

In other words, in this kind of electronic device, a circuit board on which an electronic circuit including a preamplifier circuit is provided to mount a connector, a mounting base fixed to a glass surface of a window of a vehicle so that the circuit board is placed and fixed on the mounting base, a connection terminal that enables a feeding electrode and a ground electrode of the electronic circuit to be electrically connected with a pair of feeding units of the antenna radiation conductor, and the like are provided. A foreign signal amplified by this kind of electronic device is transmitted, via a signal cable connected to a connector, to a reception circuit, and the like which are installed in another location of the vehicle, so that a television broadcast, and the like may be viewed through an in-vehicle display device.

In this manner, in an electronic device which is used after being mounted on a glass surface of a window of a vehicle, adjustment of the electronic circuit, the replacement of a part, or the like is efficiently carried out when the circuit board is removed from the glass surface, so that it is easy to perform repair and maintenance of the electronic device even after it has been mounted on the glass surface, thereby providing convenience. Therefore, in the related art, there has been suggested an in-vehicle electronic device in which a mounting base to which an insert nut is attached is adhered and fixed to a glass surface of a window of a vehicle, and a mounting screw that penetrates through the circuit board is screwed to a corresponding insert nut, so that the circuit board is fastened and fixed on the mounting base, and a pair of connection terminals is interposed between the circuit board and the mounting base (for example, see Japanese Unexamined Patent Application Publication No. 2010-132216). In the in-vehicle electronic device in the related art, by unscrewing the mounting screw, it is possible to remove the circuit board from the mounting base fixed to the glass surface.

However, as in the above-described example of the related art, in an in-vehicle electronic device in which a circuit board is fastened and fixed to a mounting base by a mounting screw, there is a problem in that it is difficult to smoothly perform removal of the circuit board when the mounting position of the electronic device with respect to the glass surface of the window of the vehicle is not suitable for screwing and unscrewing the mounting screw. In other words, the mounting base of this kind of electronic device is generally fixed to the edge of a glass surface of a window of a vehicle; however, there are cases where there is a limitation due to the in-vehicle layout near the head of the mounting screw, and it is not possible to secure the operational space required to unscrew the mounting screw using a tool such as a screwdriver. In addition, if the mounting position of the electronic device with respect to the glass surface of the window of the vehicle is limited to a certain extent in order to avoid this situation, there is a problem in that the arrangement position of the antenna radiation conductor is limited as a result.

SUMMARY

According to an aspect of the disclosure, there is provided an in-vehicle electronic device in which a substantially rectangular holding case which stores a circuit board is configured by combining a lower case fixed to a glass surface of a window of a vehicle and an upper case detachably mounted on the lower case so as to cover the lower case, and an electronic circuit provided in the circuit board is electrically connected with an antenna radiation conductor arranged on the glass surface. Here, the in-vehicle electronic device includes: an elastic piece configured to be formed at one end of the upper case in the longitudinal direction, and capable of being pressed and bent to the other end in the longitudinal direction; a snap claw configured to be formed such that a part of the elastic piece protrudes to the one end of the upper case in a longitudinal direction; a protruded portion configured to extend from a tip of the elastic piece to one end of the upper case in the longitudinal direction; a notched portion configured to be formed by notching the vicinity of a base end of the protruded portion; and a tongue piece configured to be formed at one end of the lower case in a longitudinal direction, and have a locking hole, wherein a position in which the tongue piece and the elastic piece face each other engages the notched portion, so that the upper case is attached to and detached from the lower case by engaging and disengaging the snap claw with the locking hole.

In the in-vehicle electronic device configured as above, since the elastic piece may be bent by pushing a tip of the protruded portion of the upper case to the base end side using a finger, or the like, the snap claw protruding from the elastic piece may be separated from the locking hole of the tongue piece of the lower case, so that the upper case may be detached from the lower case. In addition, even when a tool such as a screwdriver, or the like inserted into the notched portion at the vicinity of the base end of the protruded portion is pushed toward the glass surface of the window of the vehicle, both the tongue piece and the elastic piece are pressed and bent in mutually separate directions by inserting the tool in between the tongue piece and the elastic piece, so that the snap claw may be separated from the locking hole, thereby enabling the upper case to be detached from the lower case. In other words, detachment of the upper case from the lower case that is fixed on a glass surface of a window of a vehicle may be easily carried out in the lateral direction of the holding case or in the upward direction thereof, so that the in-vehicle electronic device may does not hinder the removal of the circuit board regardless of where on the glass surface the in-vehicle electronic device is mounted.

DESCRIPTION OF THE EXEMPLARY EMBODIMENTS

Figure 1:
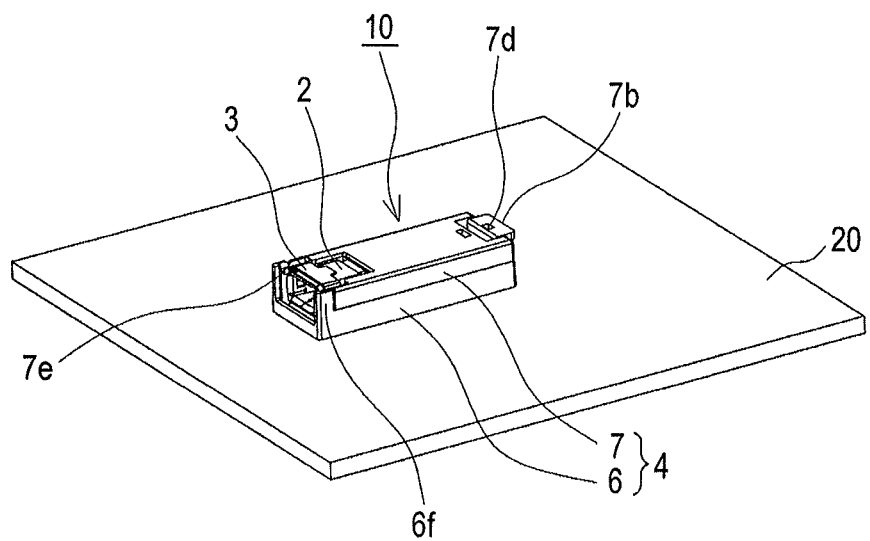
FIG. 1 is a perspective diagram illustrating a state in which an in-vehicle electronic device according to an embodiment of the present invention is mounted on a glass surface of a window of a vehicle.
Figure 2:
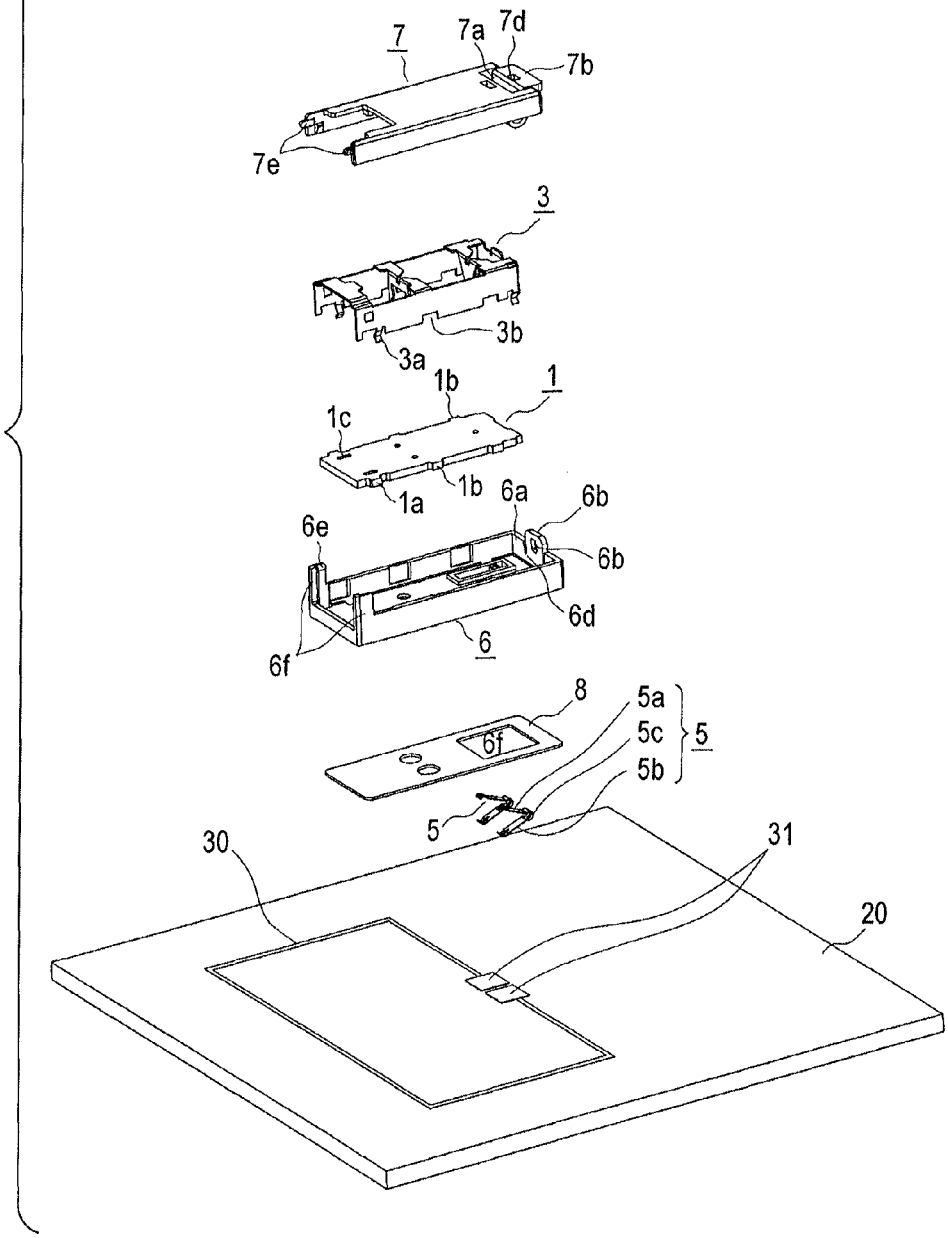
FIG. 2 is an exploded perspective diagram illustrating the in-vehicle electronic device.

Hereinafter, embodiments of the invention will be described with reference to the accompanying drawings. As illustrated in FIG. 1, an in-vehicle electronic device 10 according to an embodiment of the invention is mounted on a glass surface 20 of a window of a vehicle (for example, a rear window) to thereby be used. As illustrated in FIG. 2, an antenna radiation conductor 30 is arranged on the glass surface 20, so that a foreign signal received from the antenna radiation conductor 30 is amplified in the in-vehicle electronic device 10, and then the amplified signal is transmitted to a reception circuit, which is not illustrated.

Figure 4:
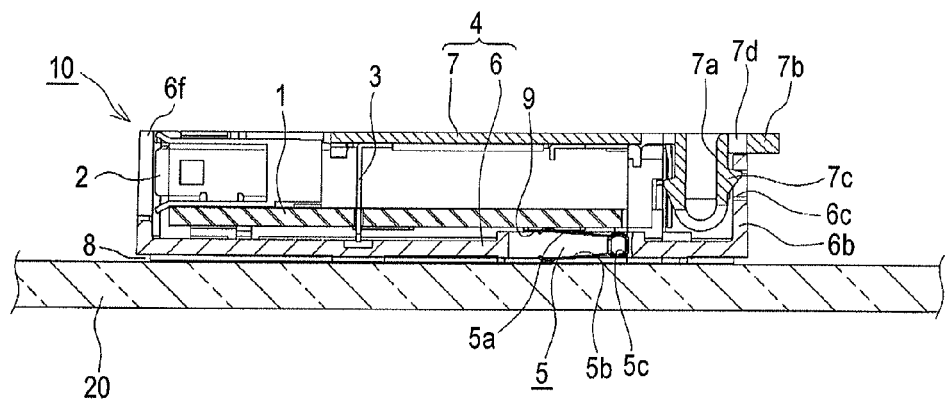
FIG. 4 is a cross-sectional diagram taken along an A-A line of FIG. 3.

The in-vehicle electronic device 10 roughly includes a circuit board 1 in which an electronic circuit, which is not illustrated, electrically connected with the antenna radiation conductor 30 is provided, an external connection connector 2 which is mounted on the circuit board 1, a shield case 3 which is integrated with the circuit board 1 to electromagnetically shield the electronic circuit, a substantially rectangular holding case 4 which stores the circuit board 1 and the shield case 3, and a pair of connection terminals 5 which enables a pair of electrodes 9 (see, FIG. 4) of the electronic circuit to be connected to a pair of feeding units 31 of the antenna radiation conductor 30, and the holding case 4 is configured by combining a lower case 6 and an upper case 7. The lower case 6 is fixed to the glass surface 20 by a double-sided adhesive tape 8, so that the pair of connection terminals 5 is held in the lower case 6. Meanwhile, the upper case 7 is detachably mounted on the lower case 6 so as to cover the lower case 6, so that the circuit board 1 and the shield case 3 may be assembled at the upper case 7 as illustrated FIG. 7 or 8.

Figure 3:
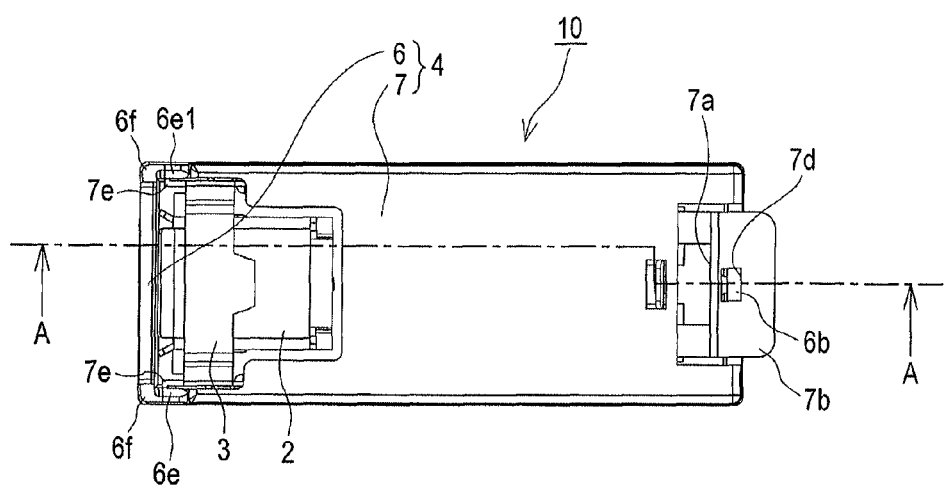
FIG. 3 is a plane diagram illustrating the in-vehicle electronic device.

Next, the structure of the holding case 4 will be described in detail. At one end of the upper case 7 in the longitudinal direction (a right end in FIG. 3 or 4), an elastic piece 7a that is substantially U-shaped in a side view is provided, and a protruded portion 7b extending from an upper tip of the elastic piece 7a to one end of the holding case 4 in the longitudinal direction is provided. In addition, a part of the vicinity of the tip of the elastic piece 7a is formed as a snap claw 7c, which protrudes to one end of the holding case 4. In the protruded portion 7b, a notched portion 7d is bored into the vicinity of a base end, which is continuous with the elastic piece 7a, and is formed in a rectangular shape in a plane view. In addition, in a top plate of the upper case 7, the other end in the longitudinal direction is greatly notched, and an engagement projection 7e projects from each of a pair of side plates facing each other through the notched portion (see, FIG. 2). The upper case 7 may be attached to and detached from the lower case 6 by engaging and disengaging the snap claw 7c with and from a locking hole 6c which will be described later.

In the lower case 6, a part of a side plate 6a held in one end of the lower case 6 in the longitudinal direction (right end of FIG. 3 or FIG. 4) is used as a tongue piece 6b, so that the locking hole 6c capable of locking the snap claw 7c of the upper case 7 is bored into the tongue piece 6b (see, FIG. 2). The tongue piece 6b is disposed to face the elastic piece 7a of the upper case 7, so that in a position in which the tongue piece 6b and the elastic piece 7a face each other it engages the notched portion 7d of the upper case 7 (see, FIG. 5). In the side plate 6a, a cut 6d is formed along both side-edges of the tongue piece 6b in a width direction, thereby increasing flexibility of the tongue piece 6b due to the presence of the cut 6d. In addition, at the other end of the lower case 6 in the longitudinal direction, a pair of columnar portions 6f is erected on a pair of side plates facing each other in a width direction, and a tapered thick wall portion 6e is formed in the vicinity of each tip of the pair of columnar portions 6f. At the time of mounting the upper case 7 to the lower case 6, each of the engagement projections 7e may be locked (snap-locked) at the corresponding thick wall portion 6e when the pair of columnar portions 6f is pressed and bent to the outside in a width direction by a pair of engagement projections 7e.

In addition, the lower case 6 may have a configuration in which the tongue piece 6b projects from the side plate 6a without the cut 6d being formed; however, when the cut 6d is provided along both side-edges of the tongue piece 6b in the width direction, a required flexibility may be imparted to the tongue piece 6b while a height dimension of the lower case 6 is suppressed.

The electronic circuit provided in the circuit board 1 includes a preamplifier circuit, and a foreign signal received by the antenna radiation conductor 30 is amplified in the preamplifier circuit, and then the amplified signal is transmitted to the reception circuit via the connector 2, thereby obtaining excellent reception sensitivity. In the circuit board 1, a fitting recess 1a for fitting a mounting leg 3a of the shield case 3, a fitting projection 1b for outer fitting a cut portion 3b of the shield case 3, and a mounting hole 1c for mounting the connector 2 are provided. In addition, on a bottom surface of the circuit board 1, the above described pair of electrodes 9 (a feeding electrode and a ground electrode) is provided (see, FIG. 4).

The connection terminal 5 is constituted of a metal plate having excellent spring properties such as phosphor bronze, and includes a first contact piece 5a and a second contact piece 5b. The first contact piece 5a and the second contact piece 5b are formed so as to project to an oblique upper side and an oblique lower side, and an intermediate support portion 5c in which base ends of both of the contact pieces 5a and 5b are connected with each other is held in the lower case 6 (see, FIG. 4). Next, when fixing the lower case 6 to the glass surface 20, the second contact piece 5b of the pair of the connection terminals 5 is brought into press-contact with the pair of feeding units 31 of the antenna radiation conductor 30. In addition, when mounting the upper case 7 to the lower case 6, the first contact piece 5a of the pair of the connection terminals 5 is brought into press-contact with the pair of electrodes 9 (the feeding electrode and the ground electrode) provided on the bottom surface of the circuit board 1. As a result, the feeding unit 31 and the electrode 9 are electrically connected through the connection terminal 5. In addition, in the upper case 7 mounted on the lower case 6, an elastic force from the connection terminal 5 is exerted through the circuit board 1, so that the upper case 7 is biased at all times in a direction separated from the glass surface 20. In addition, the second contact piece 5b of the connection terminal 5 is soldered to the feeding unit 31, thereby increasing connection strength.

In the in-vehicle electronic device 10 configured as above, the upper case 7 may be attached to and detached from the lower case 6 fixed to the glass surface 20, so that the circuit board 1 assembled in the upper case 7 may be removed from the glass surface 20 even after mounting the upper case 7 to the glass surface 20, so that it is possible to efficiently carry out repair or maintenance of the electronic circuit, and the like.

Figure 5:
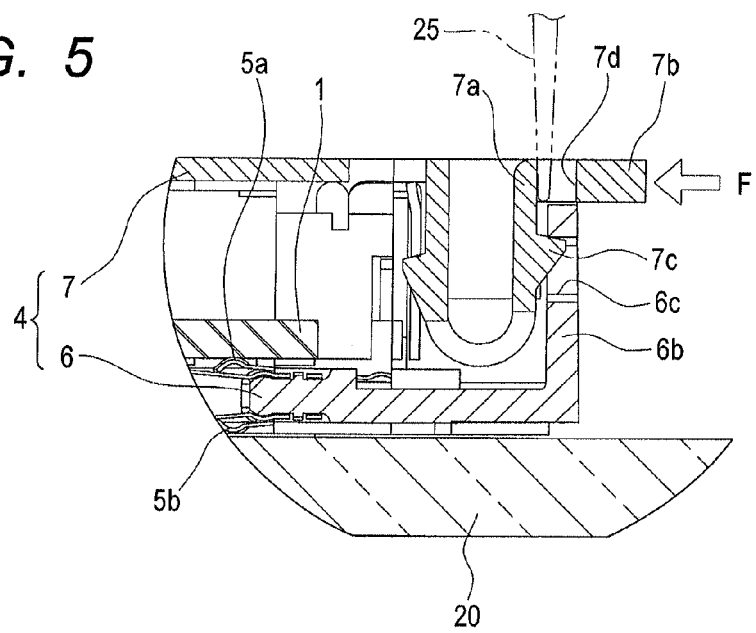
FIG. 5 is an enlarged diagram of the main parts of FIG. 4.
Figure 7:
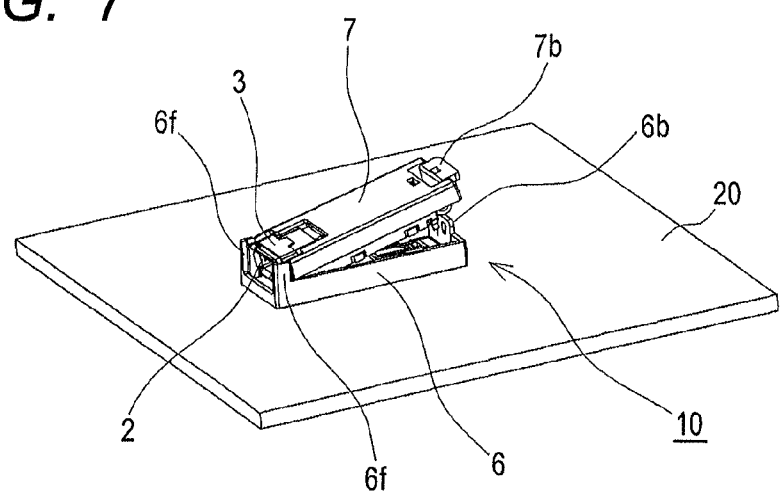
FIG. 7 is a perspective diagram illustrating a state immediately before an upper case of the in-vehicle electronic device is detached from a lower case.

When the upper case 7 is removed from the lower case 6, the elastic piece 7a is bent by pushing the tip of the protruded portion 7b of the upper case 7 to the base end side using an operator's finger, or the like as shown by an arrow F of FIG. 5, so that the snap claw 7c may be engaged and disengaged with and from the locking hole 6c of the tongue piece 6b. In this manner, when the snap claw 7c is disengaged from the locking hole 6c, the circuit board 1 is pushed up by an elastic force of the connection terminal 5, so that the upper case 7 holding the circuit board 1 is slightly elevated at one end thereof in the longitudinal direction. Accordingly, as illustrated in FIG. 7, by lifting the one end of the obliquely inclined upper case 7 in the longitudinal direction, the upper case 7 slidably moves as is to an oblique upper side, so that the pair of engagement projections 7e is pulled out from a lower side of the corresponding thick wall portion 6e, whereby it is possible to easily remove the upper case 7 from the lower case 6.

Beyond this, as shown by a two-dot chain line in FIG. 5, a removal method of pushing a tool 25 such as a minus screwdriver, or the like toward the glass surface 20 by inserting the tool 25 into the notched portion 7d of the upper case 7 may be used. In other words, when inserting the tool 25 in between the elastic piece 7a and the tongue piece 6b, both the elastic piece 7a and the tongue piece 6b may be pressed and bent in mutually separate directions, so that the snap claw 7c may be separated from the locking hole 6c. Even in this case, when the snap claw 7c is removed from the locking hole 6c, the upper case 7 is slightly elevated at one end thereof in the longitudinal direction due to the circuit board 1 pushed up by the elastic force of the connection terminal 5, so that the upper case 7 may be easily removed from the lower case 6.

Figure 6:
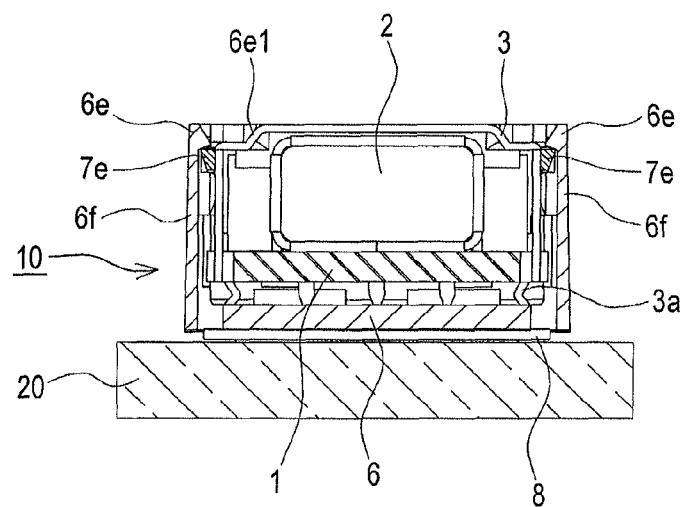
FIG. 6 is a cross-sectional diagram illustrating the vicinity of a connector of the in-vehicle electronic device.
Figure 8:
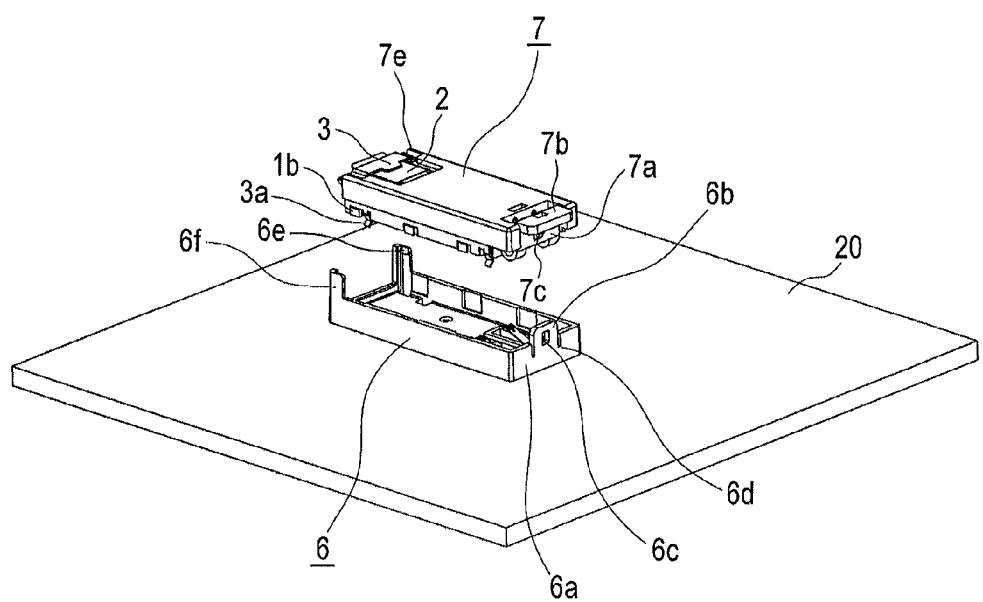
FIG. 8 is a perspective diagram illustrating a state immediately before the upper case of the in-vehicle electronic device is mounted on the lower case.

In addition, when mounting the upper case 7 on the lower case 6, the upper case 7 may be pushed from directly above the lower case 6 as illustrated in FIG. 8. By doing this, the pair of engagement projections 7e is engaged with a tapered surface 6e1 (see, FIG. 6) of the corresponding thick wall portion 6e and bent so as to press and open the pair of columnar portions 6f, so that each of the engagement projections 7e may be snap-locked at the corresponding thick wall portion 6e. In addition, by inserting the elastic piece 7a into the tongue piece 6b, the snap claw 7c may be snap-locked at the locking hole 6c while both the elastic piece 7a and the tongue piece 6b are pressed and bent. In this manner, by simply pushing the upper case 7 disposed directly above the lower case 6, both ends in the longitudinal direction may be snap-locked, so that the upper case 7 may be easily and reliably mounted on the lower case 6. However, as illustrated in FIG. 7, even when each of the engagement projections 7e is inserted to a lower side of the corresponding thick wall portion 6e by inclining the upper case 7, and then the snap claw 7c is snap-locked at the locking hole 6c by inserting the elastic piece 7a into the tongue piece 6b, the upper case 7 may be easily and reliably mounted on the lower case 6.

As described above, in the in-vehicle electronic device 10 according to the present embodiment, since the elastic piece 7a may be bent by pushing the tip of the protruded portion 7b of the upper case 7 to the base end side using an operator's finger, or the like in a state in which the in-vehicle electronic device 10 is mounted on the glass surface 20 of the window of the vehicle, the snap claw 7c protruding from the elastic piece 7a may be removed from the locking hole 6c of the tongue piece 6b, so that the upper case 7 including the holding case 4 may be simply detached from the lower case 6.

In addition, even when the tool 25 such as a minus driver, or the like which is inserted to the notched portion 7d at the vicinity of the base end of the protruded portion 7b is pushed toward the glass surface 20 of the window of the vehicle, both the tongue piece 6b and the elastic piece 7a are pressed and bent in mutually separate directions by inserting the tool 25 in between the tongue piece 6b and the elastic piece 7a, so that the snap claw 7c may be separated from the locking hole 6c, thereby enabling the upper case 7 to be easily detached from the lower case 6. In other words, detachment of the upper case 7 from the lower case 6 that is fixed on the glass surface 20 of the window of the vehicle may be easily carried out in the lateral direction of the holding case 4 or in the upward direction thereof, so that the in-vehicle electronic device 10 does not hinder the removal of the circuit board 1 regardless of where on the glass surface 20 the in-vehicle electronic device 10 is mounted. Therefore, in the in-vehicle electronic device 10, adjustment of the electronic circuit provided in the circuit board 1, replacement of a part, or the like is easily carried out to be suitable for repair and maintenance. Furthermore, the in-vehicle electronic device 10 may be mounted on a desired position on the glass surface 20 of the window of the vehicle, so that the arrangement position of the antenna radiation conductor 30 is not limited.

In addition, in the in-vehicle electronic device 10 according to the present embodiment, the second contact piece 5b of the connection terminal 5 which is held in the lower case 6 is brought into press-contact with the feeding unit 31 of the antenna radiation conductor 30 provided on the glass surface 20 of the window of the vehicle, and at the same time, the first contact piece 5a of the connection terminal 5 is brought into press-contact with the electrode 9 provided on the bottom surface of the circuit board 1. Since the circuit board 1 is assembled in the upper case 7, the connection terminal 5 may be elastically biased in a direction separating the upper case 7 from the glass surface 20. Accordingly, when the snap claw 7c of the upper case 7 is separated from the locking hole 6c of the lower case 6, the circuit board 1 and the upper case 7 may be slightly pushed up (elevated) by the elastic force of the connection terminal 5, so that detachment of the circuit board 1 and the upper case 7 from the lower case 6 may be extremely easily carried out.

In addition, in the holding case 4 of the in-vehicle electronic device 10, the engagement projections 7e (the upper case 7) and the columnar portions 6f (the lower case 6) having the tapered thick wall portion 6e are provided at one end in the longitudinal direction where the elastic piece 7a and the tongue piece 6b are provided and the opposite end, so that the pair of columnar portions 6f is pressed and bent to the outside by the pair of engagement projections 7e, thereby enabling each of the engagement projections 7e to be locked at the corresponding thick wall portion 6e. That is, when the upper case 7 is mounted on the lower case 6, the snap claw 7c may be snap-locked at the locking hole 6c at one end of both the lower case 6 and the upper case 7 in the longitudinal direction, and the pair of engagement projections 7e may be snap-locked at the corresponding thick wall portion 6e at the other end thereof in the longitudinal direction. Therefore, by simply pushing the upper case 7 from directly above the lower case 6, the upper case 7 may be easily and reliably mounted on the lower case 6, so that the mounting may be extremely easily carried out.

In addition, in the in-vehicle electronic device 10, the engagement projection 7e (the upper case 7) and the columnar portion 6f (the lower case 6) are provided at the corners of the holding case 4 which do not interfere with the connector 2, and the elastic piece 7a, the protruded portion 7b (the upper case 7), and the tongue piece 6b (the lower case 6) are provided at one end of the holding case 4 in the longitudinal direction, which does not interfere with the connector 2, so that design and manufacturing of the holding case 4 may be easily carried out.

It should be understood by those skilled in the art that various modifications, combinations, sub-combinations and alterations may occur depending on design requirements and other factors insofar as they are within the scope of the appended claims of the equivalents thereof.

What is claimed is:

1. An in-vehicle electronic device in which a substantially rectangular holding case which stores a circuit board is configured by combining a lower case fixed to a glass surface of a window of a vehicle and an upper case detachably mounted on the lower case so as to cover the lower case, and an electronic circuit provided in the circuit board is electrically connected with an antenna radiation conductor arranged on the glass surface, the in-vehicle electronic device, comprising:

an elastic piece configured at one end of the upper case in a longitudinal direction, and pressed and bent to the other end in the longitudinal direction;

a snap claw configured such that a part of the elastic piece protrudes to the one end of the upper case in a longitudinal direction;

a protruded portion configured to extend from a tip of the elastic piece to the one end of the upper case in the longitudinal direction;

a notched portion formed by notching the vicinity of a base end of the protruded portion; and a tongue piece configured at one end of the lower case in a longitudinal direction, and have a locking hole, wherein a position in which the tongue piece and the elastic piece face each other engages the notched portion, so that the upper case is attached to and detached from the lower case by engaging and disengaging the snap claw with and from the locking hole.

2. The in-vehicle electronic device according to claim 1, wherein a connection terminal having a spring property is held in the lower case while the circuit board is held in the upper case, so that the connection terminal is elastically biased in a direction that the upper case is separated from the glass surface by bringing one end of the connection terminal into press-contact with a first electrode provided on a bottom surface of the circuit board and by bringing the other end of the connection terminal into press-contact with a second electrode provided on the glass surface.

3. The in-vehicle electronic device according to claim 1, wherein a part of a side plate provided at the one end of the lower case in the longitudinal direction is used as the tongue piece, so that a cut is formed along both side-edges of the tongue piece in a width direction.

4. The in-vehicle electronic device according to claim 1, wherein a pair of columnar portions having a tapered thick wall portion in the vicinity of each tip thereof is erected at a position facing each other in a width direction at the other end of the lower case in the longitudinal direction while a pair of engagement projections are provided at positions facing each other in a width direction at the other end of the upper case in the longitudinal direction, so that each of the pair of engagement projections is locked at the corresponding thick wall portion by pressing and bending, to the outside, the pair of columnar portions by the pair of engagement projections.

* * * * *